(12) United States Patent
Potts

(10) Patent No.: US 6,844,218 B2
(45) Date of Patent: Jan. 18, 2005

(54) SEMICONDUCTOR WAFER WITH GROUPED INTEGRATED CIRCUIT DIE HAVING INTER-DIE CONNECTIONS FOR GROUP TESTING

(75) Inventor: David J. Potts, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 10/055,445

(22) Filed: Jan. 23, 2002

(65) Prior Publication Data

US 2003/0124816 A1 Jul. 3, 2003

Related U.S. Application Data

(60) Provisional application No. 60/344,161, filed on Dec. 27, 2001.

(51) Int. Cl.$^7$ .................... H01L 21/50; H01L 21/66; H01L 21/46
(52) U.S. Cl. .................. 438/110; 438/14; 438/460; 438/462
(58) Field of Search .................. 438/110, 113, 438/14, 15, 17, 18, 460, 461, 462

(56) References Cited

U.S. PATENT DOCUMENTS 5,059,899 A * 10/1991 Farnworth et al. ...... 324/158 R
5,444,366 A    8/1995 Chiu
5,780,161 A * 7/1998 Hsu ........................... 428/426
5,898,186 A * 4/1999 Farnworth et al. ............ 257/48

* cited by examiner

Primary Examiner—Michael Tokar
Assistant Examiner—Scott B. Geyer
(74) Attorney, Agent, or Firm—W. Daniel Swayze, Jr.; W. James Brady; Frederick J. Telecky, Jr.

(57) ABSTRACT

A method of forming a plurality of integrated circuit die on a semiconductor wafer (30). The method forms a first integrated circuit die (32$_a$) in a first area in a fixed position relative to the semiconductor wafer, by forming at least two devices (42$_a$) in the first area, the at least two devices selected from a group of active and passive devices, and by forming a first metal layer (62) comprising portions connecting to the at least two devices in the first area. The method also forms a second integrated circuit die (32$_b$) in a second area in a fixed position relative to the semiconductor wafer, the second area separated from the first area by a scribe area (34). The formation of the second integrated circuit die comprises the steps of forming at least two devices (42$_b$) in the second area, the at least two devices selected from a group of active and passive devices, and forming the first metal layer to further comprise portions connecting to the at least two devices in the second area. The method also forms the first metal layer to further comprise a portion electrically connecting a portion of the first metal layer in the first area to a portion of the first metal layer in the second area and thereby extending in the scribe area.

16 Claims, 3 Drawing Sheets

SEMICONDUCTOR WAFER WITH GROUPED INTEGRATED CIRCUIT DIE HAVING INTER-DIE CONNECTIONS FOR GROUP TESTING

CROSS-REFERENCES TO RELATED APPLICATIONS

This application claims the benefit, under 35 U.S.C. §119(e)(1), of U.S. Provisional Application No. 60/344,161 (TI-27832PS), filed Dec. 27, 2001, and incorporated herein by this reference.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to the simultaneous formation of multiple die on a wafer with common test points for each of the multiple die.

Integrated circuits are immensely prevalent in all aspects of contemporary electronic technology. Indeed, vast resources are expended in developing and implementing integrated circuit technology in order to supply demands imposed by the consuming marketplace. In this regard, the efficient production of integrated circuits is critical, and the present embodiments are directed at such efficiency. Particularly, the present embodiments improve the efficiency for testing integrated circuit during the manufacturing process and, therefore, improve the entire process of integrated circuit formation.

By way of introduction, the present state of the art for integrated circuit die fabrication includes one or more testing steps of each die so as to improve yield and to provide satisfactory devices to consumers. Testing, therefore, becomes part of the time required for fabricating and releasing integrated circuit devices. Accordingly, while the manner of testing must yield a sufficient number of acceptable devices, the time and cost for testing also must be minimized so as not to unduly drive up the price of each device, particularly given the nature of the present day competitive marketplace.

Integrated circuit testing in contemporary applications often involves the use of a probe card, such as are commercially available from the Cerprobe Corporation. The probe card typically includes a number of probe tips that extend in a tapered manner, where often the tapered tips are generally aligned in a single linear dimension so as to accommodate a set of bond pads located in the same single linear dimension on an integrated circuit die. The generally linear alignment of such bond pads is common in memory devices. However, with various other circuits, more complex constraints are imposed on the probe card due to attributes of the bond pads. For example, for devices other than memory, such as in the case of logic circuits or complex processors, often the bond pads are located on the integrated circuit die in various different locations across a two-dimensional space. As another example, the size of the bond pad as defined by its width and depth, and the distance, or "pitch", between bond pads, are reduced as compared to older devices. As still another example, more complex integrated circuit devices typically include a much larger number of bond pads, even in a single dimension; thus, there is an attendant difficulty in providing a sufficient number of probe tips that can properly align with the large number of bond pads. In all events, therefore, these added complexities have given rise to the design of probe cards with a special geometry probe array in an effort to accommodate these more complex aspects. Such specialized probe cards, however, are considerably more expensive than their simpler counterparts and, indeed, the cost of such a card, particularly for devices with relatively small pitch sizes (e.g., 13 $\mu$m or less) may run in the tens of thousands of dollars. Further, these probe cards have a limited lifespan, which in part is exhausted according to the number of probe touches that occur in the use of the card, that is, the number of times each tip is used to touch a corresponding bond pad for testing. Note also that often two touches are required per bond pad, a first touch that is considered a "scrub" for essentially ensuring a clean contact to the pad and a second touch for the actual test to be applied via the probe tip. In any event, the probe card eventually deteriorates through numerous uses and, therefore, the above-described cost is repeatedly incurred as newer probe cards are warranted.

By way of further background, U.S. Pat. No. 5,444,366 ("the '366 patent") issued on Aug. 22, 1995, entitled "Wafer Burn-In And Test System," and is hereby incorporated herein by reference. The '366 patent describes a two-step process for forming a testing apparatus on top of devices that functionally are already completed on a semiconductor wafer. The first step applies two layers, an adhesive followed by a dielectric, and then both layers are patterned to make openings to previously-formed bond pads. The first step also requires the formation of two metal layers on top of the adhesive and dielectric, with a subsequent pattern and etch to form fuse link conductors, where at one end the fuse link contacts a bond bad and at the other end the fuse link contacts a via pad. The second step applies another dielectric covering the materials described above, followed by an etch and another metal layer that creates conductors that span in a columnar fashion across multiple devices and to a test point located in the non-patterned area of the wafer. Thereafter, the test point may be used for testing and burn-in procedures.

While the '366 patent may provide a useful testing mechanism for some devices, the present inventor has observed various of its drawbacks. For example, the testing architecture provided by the '366 patent comes at the cost of adding numerous additional layers to an integrated circuit that is already functionally complete, and those extra layers correspondingly require additional processing steps before testing can occur. In addition, presumably much if not all of the testing structure is required to be removed before the integrated circuit die is usually in a circuit package or the like, thereby possibly necessitating still additional manufacturing processes. In some contemporary applications, these additional actions would be too burdensome and, thus, render the approach of the '366 patent unusable for such applications.

In view of the above, there arises a need to address the drawbacks of the prior art as well as the complexities arising in contemporary probe card applications, and such needs are addressed by the preferred embodiments described below.

BRIEF SUMMARY OF THE INVENTION

In the preferred embodiment, there is a method of forming a plurality of integrated circuit die on a semiconductor wafer. The method forms a first integrated circuit die in a first area in a fixed position relative to the semiconductor wafer, by forming at least two devices in the first area, the at least two devices selected from a group of active and passive devices, and by forming a first metal layer comprising portions connecting to the at least two devices in the first area. The method also forms a second integrated circuit die in a second area in a fixed position relative to the semiconductor wafer, the second area separated from the first area by a scribe area. The formation of the second integrated circuit die comprises the steps of forming at least two devices in the second area, the at least two devices selected from a group of active and passive devices, and forming the first metal layer to further comprise portions connecting to the at least two devices in the second area. The method also forms the first metal layer to further comprise a portion electrically connecting a portion of the first metal layer in the first area to a portion of the first metal layer in the second area and thereby extending in the scribe area. Various other aspects are also disclosed and claimed.

DETAILED DESCRIPTION OF THE INVENTION

Figure 1:
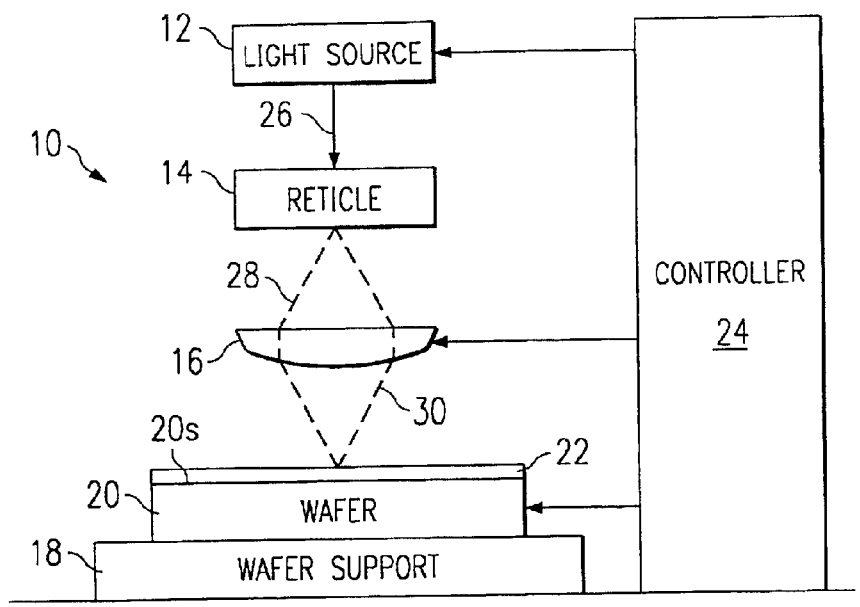
FIG. 1 illustrates a stepper system for forming a plurality of integrated circuit die on a wafer according to the preferred embodiment.

The present embodiments relate to the simultaneous formation of multiple die on a wafer with common test points for each of the multiple die. In this regard, FIG. 1 illustrates one type of a system that may perform the overall simultaneous formation, where this system is referred to as a stepper system 10. Stepper system 10 is by way of illustration, where from the later description one skilled in the art will appreciate that various modifications or substitutions may be made to system 10 while still permitting the simultaneous formation of multiple die in accordance with additional steps described later. Finally, stepper system 10 in general is known in the art, but the attributes described later give rise to an overall improved wafer device by using system 10 appropriately.

Turning then to stepper system 10 of FIG. 1, it is shown in a simplified format in that only various components are illustrated, or consolidated, in order to simplify the present discussion and to facilitate a greater understanding of the preferred embodiments; thus, one skilled in the art will appreciate that stepper system 10 may include various items in addition to, or in lieu of, those shown in FIG. 1. Stepper system 10 includes a light source 12 disposed over a plate 14, where plate 14 is typically quartz and is or has been referred to in the art by various names such as a "reticle" or a "mask." For sake of convenience, therefore, plate 14 is hereafter referred to as reticle 14. Located below reticle 14 is a projection lens 16, which actually may include more than one lens and may cooperate with one or more mirrors (not shown). Looking to the bottom of FIG. 1, stepper system 10 further includes a wafer support 18, which supports at least one wafer 20 so that its surface 20s is facing projection lens 16. A photoresist layer 22 may be placed on surface 20s. Lastly, stepper system 10 includes a controller 24 which may include electronic control circuitry and apparatus, including computer control such as through a processor or the like, so that various control actions may be taken with respect to other items in stepper system 10; by way of example, therefore, control arrows are shown from controller 24 to light source 12, projection lens 16, and wafer support 18.

A brief description of the operation of stepper system 10 is now provided. Light source 12 is energized, such as by way of a control operation from controller 24, and in response it provides a light beam 26 to reticle 14. Although not expressly shown in FIG. 1, it is known in the art that portions of reticle 14 block the passage of light while other portions of reticle 14 allow light to pass through it, thereby providing a light image 28 toward projection lens 16. Projection lens 16 then focuses and projects light image 28 so that a projected image 30 is directed toward a particular location on photoresist layer 22 and corresponding to an underlying location of surface 20s of wafer 20. A particular location is sometimes referred to in the art as an exposure or field. Once projected image 30 impinges on surface 20s, and in combination with the effect of photoresist 22, a circuit image is formed, and it should be noted that this image may form directly on surface 20s or in some other layer that has been located on surface 20s (e.g., polysilicon, silicon dioxide, silicon nitride, glass, polyamide, metals or metal alloys). In any event, the circuit image includes either a circuit element or some other photographically imparted device features in surface 20s or a layer above that surface. Lastly, it is noted that this image is also sometimes referred to in the art as a pattern.

After the steps described above, wafer support 18 moves and thereby moves wafer 20, such as by way of a control operation from controller 24. Next, the steps described above are repeated, so once more light beam 26 passes through reticle 14 to produce a light image 28, and light image 28 passes through projection lens 16 to create a projected image 30 which impinges on a different location of photoresist layer 22 corresponding to a different underlying location on wafer 20. This repeated sequence is itself repeated numerous times so that numerous images (or patterns) are formed on a single wafer. Generally each image may be a portion of a single circuit, or alternatively an image may represent multiple duplicate circuits on the wafer, as has particular application in the preferred embodiments as detailed later. Thus, stepper system 10 essentially "steps" from one image to the next and, hence, is often referred to in the art as a "stepper." Further, at each step location, a single exposure at that location is sometimes referred to as a "shot."

Figure 2:
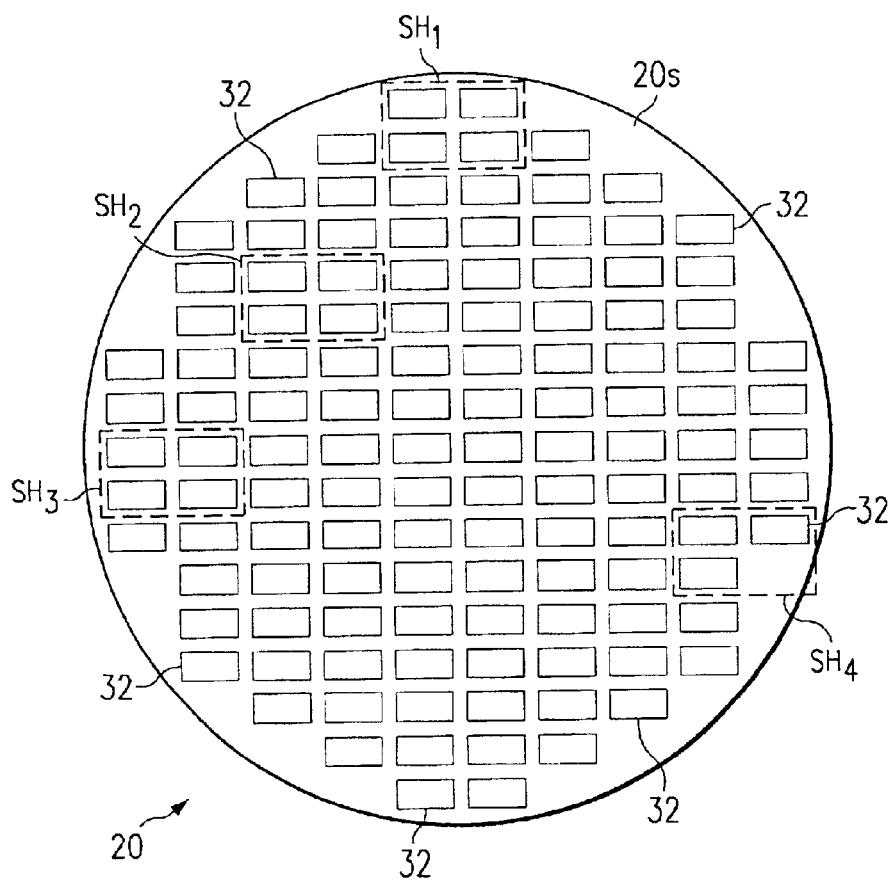
FIG. 2 illustrates a top view of wafer after numerous integrated circuit die have been formed on its surface.

FIG. 2 illustrates a top view of wafer 20 and its surface 20s from FIG. 1, after numerous integrated circuit die 32 have been formed on surface 20s using stepper system 10. For the sake of simplifying the illustration, only certain integrated circuit die 32 are labeled, while it should be understood that each unlabeled but comparable rectangle in FIG. 2 also represents an additional integrated circuit die. Given the circular nature of wafer 20, a maximum number of integrated circuit die may be formed on surface 20s generally by arranging the die in an array fashion. Near the outer boundary of wafer 20, however, in various locations die are not shown because they will not structurally fit within the area near that outer boundary; in actuality, often the circuit of a given die will be formed in part, but that partial circuit is discarded later as it is not properly usable if there was insufficient area on surface $20_s$ to form the specific integrated circuit die in its entirety.

FIG. 2 further illustrates four dashed boxes, where each box is labeled $SH_x$ and is intended to depict the area exposed in a single instance or shot by stepper system 10. In other words, recall from above the description wherein stepper system 10 performs an exposure, then wafer 20 is moved, another exposure is performed, and so forth in repeated fashion. Each exposure therefore represents a shot of the same dimension, and the example in FIG. 2 is such that such a dimension at most encompasses four integrated circuit die, as demonstrated by shots $SH_1$, $SH_2$, and $SH_3$. However, again due to the circular outer boundary of wafer 20, some shots will include less than four fully-functional integrated circuit die, such as in the example of shot $SH_4$. In any event, and for sake of the preferred embodiments, each shot $SH_x$ represents at most four integrated circuit die on wafer 20. This limitation is embodied in reticle 14 (see FIG. 1), which provides the image that defines all features to be achieved in the shoot. Naturally, the number of integrated circuit die within a shot may be adjusted in various implementations, and as further appreciated below, the present inventive teachings apply equally to such variations wherein more than one integrated circuit die is exposed during a given shot.

Figure 3:
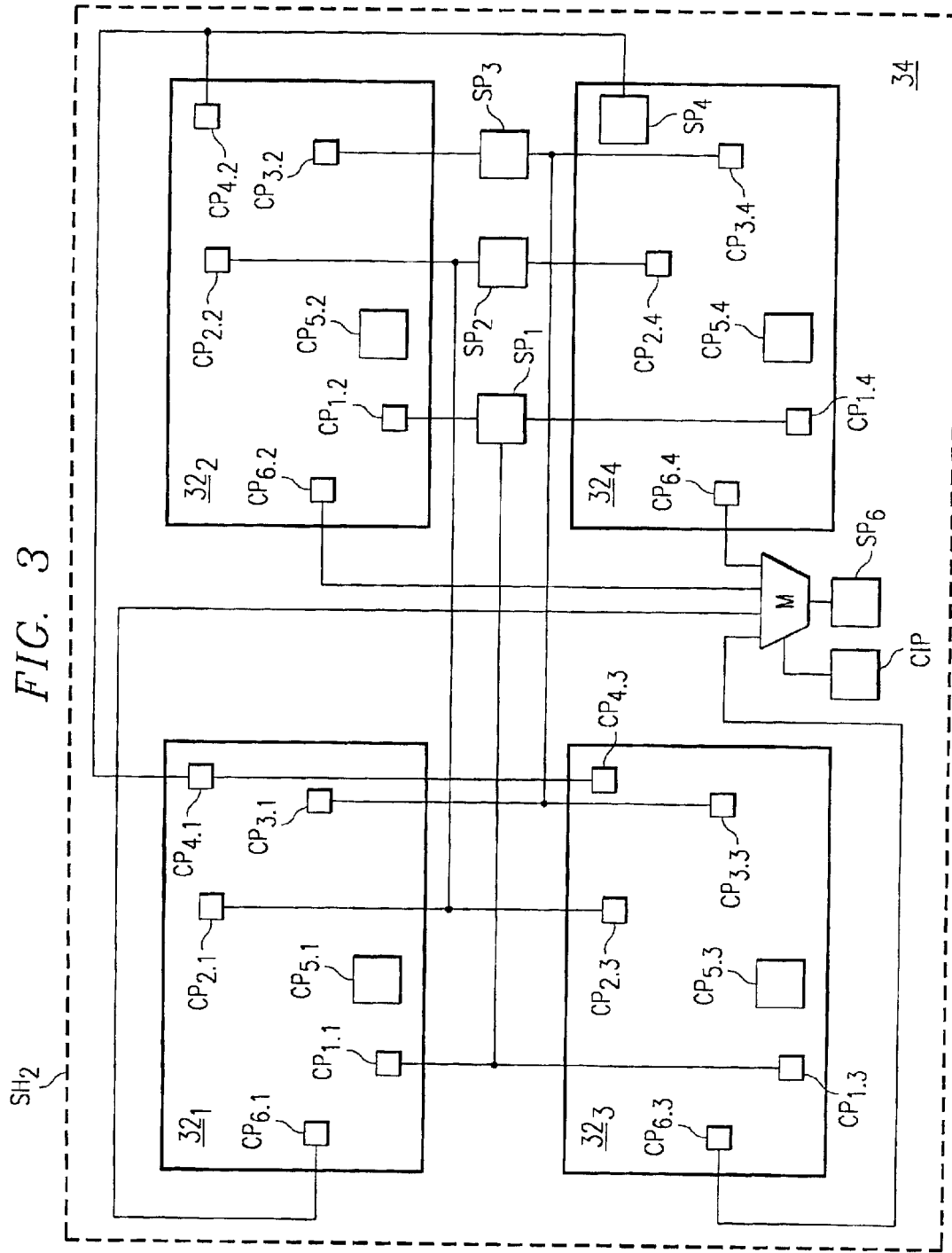
FIG. 3 illustrates shot $SH_2$ encompassing four integrated circuit die from FIG. 2 in an enlarged manner and with greater detail in order to demonstrate further aspects of the preferred embodiment.

FIG. 3 illustrates shot $SH_2$ from FIG. 2 in an enlarged manner and with greater detail in order to demonstrate further aspects of the preferred embodiment. Generally, therefore, shot $SH_2$ includes four integrated circuit die 32, and for sake of being able to distinguish each of those die from one another in the following discussion, a different subscript is added to the generally designation of 32 in FIG. 3 so that the Figure illustrates die $32_1$, $32_2$, $32_3$, and $32_4$. FIG. 3 further illustrates the remaining scribe area 34, which is that area within shot $SH_2$ but not covered by any of the integrated circuit die 32 and required so that after manufacturing each die $32_x$ may be separated from wafer 20 such as with the use of a saw or the like. Further, and as discussed below and as known in the art, after completing the formation of the circuitry of each die 32 of wafer 20, then each die 32 is physically separated from one another by cutting within scribe area 34. Typically, therefore, the prior art does not contemplate the formation of usable circuitry or conductors within scribe area 34, since such structures would be destroyed by the cutting process; as shown below, however, the preferred embodiments indeed do contemplate the inclusion of various structure within scribe area 34, despite the later destruction of that structure which may occur during the subsequent cutting in scribe area 34. As shown below, such destruction is acceptable because as of that point such structure has completed its useful purpose. Lastly, note that while FIG. 3 is shown in an accurate schematic sense, the actual layout of various contacts and conductors is by way of illustrating electrical function, where one skilled in the art may for various reasons (e.g., length and complexity reduction) choose to route the conductors and locate the contacts in alternative manners.

By way of further introduction to the preferred embodiments and FIG. 3, the preferred embodiments endeavor to reduce and/or simplify the number of test points by creating shared pads that are for accessing by probe tips or the like during testing, where the shared pad test points generally represent electrical junctions of contact pads from more than one integrated circuit die within a shot $SH_x$. These aspects are now further explored in detail in connection with FIG. 3, which depicts various examples of how such pads may be formed according to the preferred embodiment. Further, while FIG. 3 provides various examples, still others will be ascertainable by one skilled in the art given the teachings in this document as continued below.

Looking to a first example of a preferred embodiment from FIG. 3, each integrated circuit die $32_x$ includes a contact pad $CP_{1,x}$, preferably in a comparable physical position with respect to each die. In other words, die $32_1$ includes contact pad $CP_{1,1}$, die $32_2$ includes contact pad $CP_{1,2}$, and so forth. Each contact pad $CP_{1,x}$ is electrically connected to a single shared pad $SP_1$, where shared pad $SP_1$ is formed within scribe area 34. In the preferred embodiment and in contrast to the prior art, shared pad $SP_1$ and the connections from each contact pad $CP_{1,x}$ to shared pad $SP_1$ are formed during the same process steps as the fabrication of contacts and interconnections within each die $32_x$, as is described below with reference to FIG. 4.

Figure 4:
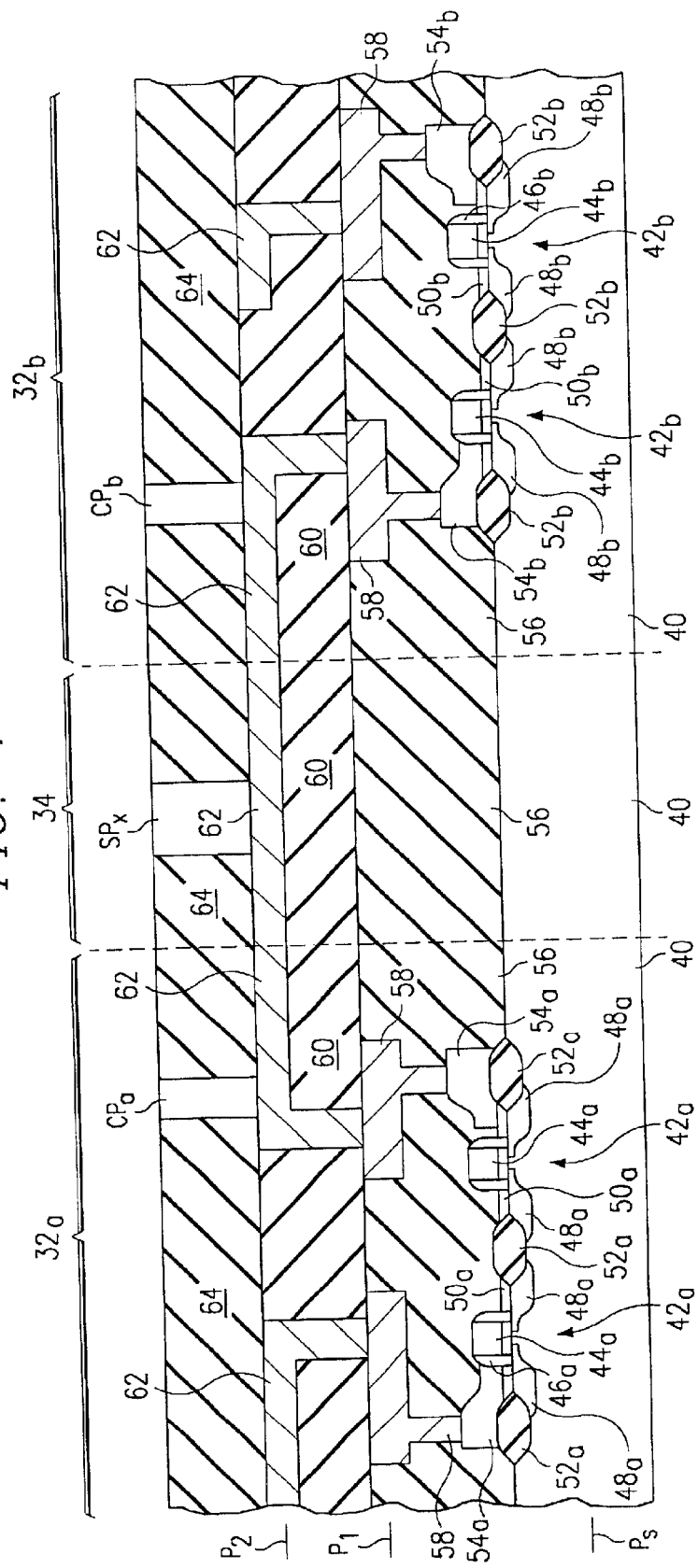
FIG. 4 illustrates a cross-sectional view that in general depicts the manner of connecting contact points $CP_a$ and $CP_b$ on two different integrated circuit die $32_x$ from shot $SH_2$ to a mutual shared point $SP_x$.

FIG. 4 illustrates a cross-sectional view that in general depicts the manner of connecting two contact points $CP_a$ and $CP_b$, on two different integrated circuit die $32_x$, to a mutual and single shared point $SP_x$. The illustration of FIG. 4 is not expressly along any particular cross-sectional line from FIG. 3, but as appreciated below is intended as a more general illustration of the process steps and the fabrication of contacts and interconnections within each integrated circuit die $32_x$ as well as in scribe area 34. Looking specifically to the FIG. 4, it includes two integrated circuit die $32_a$ and $32_b$, which may correspond to any two corresponding integrated circuit die $32_x$ in FIG. 3. Located between integrated circuit die $32_a$ and $32_b$ is a scribe area 34, where each of integrated circuit die $32_a$, $32_b$, and scribe area 34 is formed in fixed relation relative to a same semiconductor substrate 40. Substrate 40 is supported or is part of wafer 20 described earlier. Within each integrated circuit die $32_a$ and $32_b$, various known devices, both active and passive, may be formed using stepper system 10. By way of a very common example, therefore, each die $32_a$ and $32_b$ is shown to include two respective transistors $42_a$ and $42_b$, which are the same for the sake of example and which are shown in a fairly common configuration according to the contemporary prior art. For example, each transistor $42_a$ includes a gate stack $44_a$ with sidewalls $46_a$. Source/drain regions $48_a$ are self-aligned with respect to gate stack $44_a$ and are formed in substrate 40, with contact regions $50_a$ on top of source/drain regions $48_a$. Further, each transistor $48_a$ is isolated with isolation regions $52_a$. Additionally, two interconnects $54_a$ are shown contacting respect contact regions $50_a$ and extending over each of the isolation regions $52_a$. Lastly, once each of the two transistors $42_a$ is complete, an insulating layer 56 (e.g., dielectric) is formed over the device. Note that insulating layer 56 is also formed in scribe area 34 over substrate 40.

After the various devices, including transistors $42_a$ and $42_b$, are formed at a first level in die $32_a$ and $32_b$, additional layers are formed to support interconnections within each die. Thus, appropriate holes are cut through insulating layer 56 through use of an appropriate reticle 14 in stepper system 10 of FIG. 1, and then a first metal layer 58, sometimes referred to as metal-1, is formed over insulating layer 56. Where metal layer 58 extends along insulating layer 56 it defines a planar level shown as plane $P_1$. Where metal layer 58 extends within the holes formed in insulating layer 56, it provides connectivity, such as shown by way of example where two different portions of metal layer 58 connect to respective interconnects $54_a$ in die $32_a$ and where two different portions of metal layer 58 connect to respective interconnects $54_b$ in die $32_b$. While not shown, it is anticipated that for each die, metal layer 58 may have many portions, all extending generally along the same plane $PL_1$ in a dimension that is generally parallel to a plane $P_S$ defined by the majority axis dimension of substrate 40. Note also that in an alternative approach, an additional insulating layer may be formed first over insulating layer 56 and then patterned prior to the formation of metal-1, but such an approach is not illustrated in FIG. 4.

Continuing with FIG. 4, after metal-1, other metal layers may be formed, again with one or more corresponding insulating layers separating subsequent metals from previous metals. By way of example in FIG. 4, therefore, an additional insulating layer 60 is formed in the area of each of die $32_a$, $32_b$ and in scribe area 34. Next, appropriate holes and channels are cut within insulating layer 60, through the use of another appropriate reticle 14 in stepper system 10 of FIG. 1. Next, a second metal layer 62, often referred to as metal-2, is formed on top of insulating layer 60 and extends within the channels and holes previously formed therein. By way of example in FIG. 4, different portions of second metal layer 62 are therefore shown at the same planar level shown as plane $P_2$, and those portions connect to different items within each of die $32_a$ and $32_b$. In a like manner, various additional metal layers may be formed. In both the prior art and the preferred embodiments, these additional metal layers achieve desired circuit connectivity within each die $32_x$. However, in the preferred embodiments and unlike the prior art, at the same time that intra-die connectivity (i.e., within the same die) is achieved, the same metal layer 62 is used to achieve inter-die connectivity, that is, it is used to electrically connect items in two different die to one another. To illustrate this aspect in the example of FIG. 4, metal layer 62 makes various connections within each of die $32_a$ and $32_b$, but it also extends through scribe area 34 and therefore connects one portion of metal layer 58 of die $32_a$ to one portion of metal layer 58 of die $32_b$.

Completing FIG. 4, after the formation of metal layer 62 (i.e., metal-2), an additional insulating layer 64 is formed and patterned, and a final metal layer is used to form various contacts through insulating layer 64 to metal layer 62. In the illustrated example, these contacts include shared pad $SP_x$ as well as contact pads $CP_a$ and $CP_b$. In both the prior art and the preferred embodiments, this additional metal layer provides surface contacts for each die $32_x$ so that electrical access may be made from the surface of the die to connections below the surface. However, in the preferred embodiments and unlike the prior art, at the same type such intra-die surface contacts are formed, a contact may be made in scribe area 34. Indeed, in many cases such as illustrated in FIG. 4 with respect to shared pad $SP_x$, such a scribe area surface contact may provide electrical access to the sub-surface inter-die metal electrical connection (e.g., metal layer 62). Further, in one preferred embodiment, and as shown in FIG. 4 (and FIG. 3), the upper surface contact dimensions of shared pad $SP_x$ are larger than those of contact pads $CP_a$ and $CP_b$, for reasons further explored later, although alternatively the shared pad $SP_x$ surface could be smaller if a reduced size is still adequate for testing.

Given the above, one skilled in the art will appreciate that as of the time of completion of the final metal contacts $CP_a$ and $CP_b$ which are at a processing step that is already contemplated in the prior art, there also has been formed at least one level of inter-die metal. Accordingly, at the same time that each die is electrically and functionally complete for the purposes of operating as an individual unit as will occur once it is separated from wafer 20, the testing architecture as provided by inter-die metal layer 62 and shared pad $SP_x$ is also complete. Thus, the formation of the inter-die metal and contact thereto does not prolong the manufacturing process by requiring additional steps or additional layers beyond those already implemented in the prior art. In other words, in the prior art a distance $D_{max}$ may be defined between the plane $P_S$ of the substrate and the plane $P_2$ of the farthest intra-die metal connecting layer. According to the preferred embodiment, however, at that same distance $D_{max}$ or below that distance, there is also formed at least one level of inter-die metal connectivity. Thus, the inter-die metal is at a distance from substrate 40 that is no greater than the distance between substrate 40 and the plane of the intra-die metal layer that is farthest from substrate 40.

Returning now to FIG. 3, some additional observations are noteworthy with respect to the example of contact pads $CP_{1.1}$, $CP_{1.2}$, $CP_{1.3}$, and $CP_{1.4}$, as well as their connection to shared pad $SP_1$. First, one skilled in the art should now appreciate how the mutual connections of each of these contact pads to shared pad $SP_1$ are preferably achieved using one of the intra-die metal layers to also achieve an intra-die connection. Further, with the use of a shared pad $SP_1$, in subsequent testing such as through use of a probe card, then only one probe tip is required to access shared pad $SP_1$ as compared to accessing each of contact pads $CP_{1.1}$, $CP_{1.2}$, $CP_{1.3}$, and $CP_{1.4}$. Indeed, recall the preceding discusses one preferred approach of making shared pad $SP_1$ physically larger than the contact pads. Such an approach is preferable where the majority or all of testing contact will be to shared pad $SP_1$; in other words, in contemporary applications, often the size of all contact pads is driven by the need for probe testing, that is, the contact pads are required to be large enough to allow for testing. The increased demand for size is also present in the art to provide a satisfactory contact once testing is complete, because in some instances the testing itself may damage a portion of the contact and, thus, the contact must be large enough to leave a satisfactory amount of surface available necessary for future electrical access to the contact. Such additional surface may be needed, for example, to adhere a solder ball to the contact after testing. In any event, in constructing the pads in the physical manner of the preferred embodiment wherein fewer number of pads are to be tested and hence only those fewer number of pads need to be relatively large in size, then the amount of surface area required in each die $32_x$ for providing test contact may be reduced, thereby decreasing the surface area required per die and, thus, increasing the total number of die that may be formed in a given wafer.

Having described one example in FIG. 3 as well as the preferred embodiment as demonstrated by way of example in FIG. 4, one skilled in the art will appreciate that shared pad $SP_1$ and the connections from each contact pad $CP_{1.x}$ to shared pad $SP_1$ are formed during the same process steps as the fabrication of contacts and interconnections within each die $32_x$. This aspect is particularly beneficial for various reasons. As one example of a benefit, the connectivity provided by the shared connections allows a later test, such as through use of a probe card, to be made to shared pad $SP_1$, which thereby allows access to each die $32_x$ connected to that shared pad $SP_1$. In the example of FIG. 3, therefore, physical and electrical access to shared pad $SP_1$ provides electrical access to each of contact pads $CP_{1.1}$, $CP_{1.2}$, $CP_{1.3}$, and $CP_{1.4}$. Thus, in response to a probe touch at shared pad $SP_1$, each of die $32_1$, $32_2$, $32_3$, and $32_4$ may be tested. As another example of a benefit, due to the central location and size of shared pad $SP_1$, the probe card may be constructed with less complexity than would be required to provide physical access to each of contact pads $CP_{1.1}$, $CP_{1.2}$, $CP_{1.3}$, and $CP_{1.4}$. Note also in this regard, however, that alternatively shared pad $SP_1$ could be smaller in physical dimension if a reduced size is still adequate for testing. As still another example of a benefit, recall from above that the inter-die connections are formed at the same time as the intra-die connections; as a result, no additional manufacturing steps are required beyond those that were already required to construct each individual die $32_x$; in other words, only the specific reticle need be altered and in a single shot $SH_x$ the metal layer(s) necessary to achieve intra-die metal connectivity is/are also used to achieve inter-die metal connectivity. Accordingly, the preferred embodiments may be implemented with little or no impact on the cost and complexity of the manufacturing process.

A second example of a preferred embodiment from FIG. 3 is now explored, and which is comparable in most respects to that described above. Particularly, each integrated circuit die $32_x$ includes a contact pad $CP_{2.x}$ and a contact pad $CP_{3.x}$, again preferably in a comparable physical position with respect to each die. Each of these contact pads $CP_{2.x}$ and $CP_{3.x}$ is electrically connected to a respective shared pad $SP_2$ and $SP_3$, where shared pads $SP_2$ and $SP_3$ are formed within scribe area 34. As in the case of shared pad $SP_1$ with respect to shared pads $SP_2$ and $SP_3$ the connections from each respective contact pad $CP_{2.x}$ and $CP_{3.x}$ are formed during the same process steps as the fabrication of the intra-die connections within each die $32_x$, as described above with reference to FIG. 4. Given these additional examples, note that shared pads $SP_1$, $SP_2$, and $SP_3$ are aligned in a single dimension. As a result, a probe card constructed to contact these shared pads may be more easily fabricated to accommodate the linear-dimension touches required, particularly as compared to the non-linear alignment of each set of contact pads $CP_{2.x}$ and $CP_{3.x}$. Also, one skilled in the art will appreciate that each shared pad $SP_2$ and $SP_3$ once again provides electrical access to the contact pads to which the shared pad is connected. Thus, physical and electrical access to shared pad $SP_2$ provides electrical access to each of contact pads $CP_{2.1}$, $CP_{2.2}$, $CP_{2.3}$, and $CP_{2.4}$, and physical and electrical access to shared pad $SP_3$ provides electrical access to each of contact pads $CP_{3.1}$, $CP_{3.2}$, $CP_{3.3}$, and $CP_{3.4}$. Thus, in response to a probe touch at one shared pad $SP_2$ or $SP_3$, the corresponding electrical connections at each of die $32_1$, $32_2$, $32_3$, and $32_4$ may be tested.

A third example of a preferred embodiment from FIG. 3 is now explored, and it is directed to shared pad $SP_4$ which is located within integrated circuit die $32_4$; in other words, in this example, the shared pad $SP_4$, unlike the previous examples, is not formed within scribe area 34. Looking to the electrical connections, each integrated circuit die other than die $32_4$ includes a contact pad $CP_{4.x}$, preferably in a comparable physical position with respect to each die. However, while shared pad $SP_4$ is also in comparable physical position within die $32_4$, it is designated as a shared pad because it is intended as the preferable touch point for later access by a probe card for the sake of testing. In addition, and consistent with the other shared pads described above, in one embodiment shared pad $SP_4$ is larger in contact dimension as compared to the contact pads to which it is electrically connected; alternatively shared pad $SP_4$ could be smaller if a reduced size is still adequate for testing and, indeed, an alternative preference may be to maintain its size to be the same as comparable contacts on other die so as to avoid any undesirable variability that might arise from using different size contacts on different die. In any event, in response to a probe touch at shared pad $SP_4$, the corresponding electrical connections at each of die $32_1$, $32_2$, and $32_3$ may be tested.

Still other alternatives are included within the preferred embodiment and relate to the ability to separately test each individual die $32_x$ within shot $SH_2$. Specifically, the preceding embodiments all demonstrate instances where contact to a single pad allows electrical access to multiple die. Should a failure be detected in response to such a test, one skilled in the art will appreciate that at that point there is no indication of which one or more of the die on shot $SH_2$ caused the failure. As a result, the preferred embodiment further contemplates additional alternatives for further testing and deciphering the location of a device failure. Two of these alternatives are illustrated in FIG. 3 and discussed below.

A first example in FIG. 3 which permits individual testing of each of the integrated circuit die $32_x$ is by way of separate contact pads $CP_{5.1}$, $CP_{5.2}$, $CP_{5.3}$, and $CP_{5.4}$. Preferably each of these contacts will relate to the same functionality on each die $32_x$, and also they are preferably located in a comparable physical position with respect to each die. Note that each separate contact pad $CP_{5.1}$, $CP_{5.2}$, $CP_{5.3}$, and $CP_{5.4}$ is electrically isolated from the others in that it does not have an inter-die connection. As a result, during subsequent testing with the use of a probe card or the like, electrical access may be made to any one of these contact pads to test the related functionality only in the respective die. For example, by testing contact pad $CP_{5.1}$, only the functionality of circuitry within die $32_1$ is tested. Of course, at the same time, different probe tips may be applied to the other contact pads $CP_{5.2}$, $CP_{5.3}$, and $CP_{5.4}$, whereby at the same time each of their respective die may be tested. The choice of which contacts are made to be isolated solely within a single die may be ascertained by one skilled in the art. One preferable consideration is to choose such isolation for signals that are sensitive to interference, such as may be the case for connections to analog devices that operate at high-frequencies. Lastly, note that consistent with the earlier illustrations, since the preferred embodiment contemplates that each contact pad $CP_{5.1}$, $CP_{5.2}$, $CP_{5.3}$, and $CP_{5.4}$ is intended for individual probe touches, then preferably the physical dimensions of the contact surface of these pads is larger than those contact pads (e.g., $CP_{1.x}$, $CP_{2.x}$) that are mutually connected to shared pads.

A second example in FIG. 3 which permits individual testing of each of the integrated circuit die $32_x$ is by way of a shared pad $SP_6$ connected to the output of a mutliplexer M. Specifically, in this example of the preferred embodiment, each die $32_x$ includes a single contact pad $CP_{6.x}$ that is connected as an input to multiplexer M, and multiplexer M also receives a control input from a control input pad CIP. In the preferred embodiment, multiplexer M is formed during the same fabrication steps used to construct the electrical components within the integrated circuit die $32_x$, and the interconnections between each contact pad $CP_{6.x}$ as an input to multiplexer M are also formed during that time. Again, therefore, those electrical conductors from each contact pad $CP_{6.x}$ to multiplexer M are formed during the formation of the intra-level metal interconnections of each die $32_x$. Given the schematic representation in FIG. 3, one skilled in the art will readily appreciate the operation of these connections and multiplexer M. Particularly, through the use of a probe card or the like, electrical access is made to control input pad CIP and shared pad $SP_6$. With those contacts, different control signals are applied to control input pad CIP to cause it, at four different times, to select each of its four input signals and couple the selected signal to shared pad $SP_6$. Further, the output at shared pad $SP_6$ is sampled for each of these four different times, thereby providing a different test of the functionality associated with each of contact pads $CP_{6.1}$, $CP_{6.2}$, $CP_{6.3}$, and $CP_{6.4}$.

Given contact pads $CP_{5.x}$, $CP_{6.x}$, multiplexer M, and shared pad $SP_6$, one skilled in the art will further appreciate that these aspects permit the group testing facilitated by shared pads $SP_1$, $SP_2$, $SP_3$, and $SP_4$ to be augmented with individual testing of each of the different die $32_x$ within shot $SH_2$. Further in this regard, note that in the preferred embodiment different strategies may be adopted for selecting the number of pads that provide grouped testing of more than one die in a shot per time versus individualized testing. For example, in one preferred embodiment, the majority of the contact pads are connected to allow group testing of all of the die within a single shot $SH_x$, while then a lesser number of selected contacts are provided to allow individual testing of each die $32_x$ on a shot $SH_x$. Further, these techniques may be modified, by way of example, such that a group of die less than all die in a single shot are connected to a shared pad; for example with respect to FIG. 3, die $32_1$ and $32_2$ could have respective contacts connected to one shared pad, while die $32_3$ and $32_4$ could have respective contacts connected to a different shared pad. In this manner, one group could be tested by access to its respective shard pad without an effect from die in the other group. Lastly, note that the choice of multiplexer M is by way of one preferred example, where various other alternative test circuitry are also contemplated to be formed in scribe area 34, either alone or in combination with a multiplexer. Such other test circuitry may include a logic gate or gates, a state machine, and other circuitry for testing as may be ascertained by one skilled in the art. In all events, such test circuitry is only anticipated as useable for testing the integrated circuit die $32_x$ during manufacturing, after which it is not used or indeed destroyed as each die $32_x$ is physically separated from wafer 20.

From the above, it may be appreciated that the above embodiments provide for a semiconductor wafer supporting numerous integrated circuit die, wherein the die are preferably grouped according to the exposure size or shot of the stepper system or comparable system for forming different groups of integrated circuit die on a wafer at different times. For each of those groups, a method and various structures have been shown whereby testing may be performed on each group of die by access to a single contact that is electrically connected via an inter-die connection to each die in the group. Moreover, the connections to the single contact are formed at the same time that interconnections within each die are formed, thereby eliminating any additional complexity, burden, and cost on the manufacturing process. Additionally, an augmenting method and structure are provided whereby some functionality of each individual die within a group may be tested, such as by providing contacts on each die that are not connected to other die in the group and/or providing additional test circuitry such as a multiplexer in the wafer scribe area so as to assist with selective access to different die in the group. Lastly, note that once the testing is complete, all the die on wafer 20 are separated from one another, such as by using known techniques which by way of example include the use of a diamond saw to cut the die apart from one another by making cuts along scribe area 34. During this step, therefore, any inter-die connections in the scribe area are severed, and any scribe-area testing circuitry may be destroyed, but such results are acceptable because as of that point it has served its useful testing purpose. Moreover, typically in the art a seal is then formed along the edge of each die. Once more, therefore, these conventionally-required steps of separating the die from one another and then sealing the die also are not burdened by the preferred embodiments and, therefore, the testing architecture and methods described above are achieved with little or no impact on the manufacturing process. Finally, note that the testing process is also improved from the preceding. For example, a probe card used in connection with testing a preferred embodiment group of die will be required to make fewer probe touches as compared to the prior art where all contact pads must be touched. As another example, the density of probe tips may be reduced which relaxes the constraints on alignment and size of those tips. Consequently, the lifespan of the probe card is increased and there is a reduction in the expense of having to more frequently replace the card. As still another example, the time for testing an entire wafer may be dramatically reduced under the preferred embodiments. Specifically, in the instance where a single shot has four die with shared pads, then all four die may be tested in a time comparable to the time previously required in the prior art to test a single die, that is, testing time is reduced to one-fourth the time required to individually test the entire shot. Comparably, therefore, the testing time for the overall wafer is reduced proportionately. Further, the greater number of die per shot and having shared testing pads, the more pronounced the reduction in testing time. Such reduction is highly valuable at a time when testing cost forms a considerable portion of the final device cost and also because more recently as other device fabrication costs have decreased, the cost and time relating to testing has increased. Accordingly, throughput during testing may be improved considerably.

Given the preceding including the many variations that have been provided, one skilled in the art should also appreciate that while the present embodiments have been described in detail, various substitutions, modifications or alterations could be made to the descriptions set forth above without departing from the inventive scope. Numerous examples have been given, and still others are contemplated. For example, the use of a group of four die per shot (i.e., group) is only by way of example, when in other embodiments a different and indeed possibly much larger number of die may be formed in a shot (e.g., 8, 16, and more) and, hence, interconnected in an inter-die manner as described. As another example, circuitry other than a multiplexer may be formed in the scribe area and which connects to more than one die for purposes of testing. Thus, these examples as well as the preceding teachings of this document further illustrate the inventive scope, which is defined by the following claims.

What is claimed is:

1. A method of forming a plurality of integrated circuit die on a semiconductor wafer, comprising:

forming a first integrated circuit die in a first area in a fixed position relative to the semiconductor wafer, comprising the steps of:

forming at least two devices in the first area, the at least two devices selected from a group of active and passive devices;

forming a first metal layer comprising portions connecting to the at least two devices in the first area;

forming a second integrated circuit die in a second area in a fixed position relative to the semiconductor wafer, the second area separated from the first area by a scribe area, comprising the steps of:

forming at least two devices in the second area, the at least two devices selected from a group of active and passive devices;

forming the first metal layer to further comprise portions connecting to the at least two devices in the second area;

forming the first metal layer to further comprise a portion electrically connecting a portion of the first metal layer in the first area to a portion of the first metal layer in the second area and thereby extending in the scribe area, wherein the semiconductor wafer comprises a semiconductor substrate;

wherein a distance $D_{max}$ is defined between a plane along the semiconductor substrate and a plane of an intra-die metal connecting layer formed as part of the first integrated circuit die and the second integrated circuit die; and wherein the first metal layer is a distance from the semiconductor substrate equal to or less than $D_{max}$.

2. A method of forming a plurality of integrated circuit die on a semiconductor wafer, comprising:

forming a first integrated circuit die in a first area in a fixed position relative to the semiconductor wafer, comprising the steps of:

forming at least two devices in the first area, the at least two devices selected from a group of active and passive devices;

forming a first metal layer comprising portions connecting to the at least two devices in the first area;

forming a second integrated circuit die in a second area in a fixed position relative to the semiconductor wafer, the second area separated from the first area by a scribe area, comprising the steps of:

forming at least two devices in the second area, the at least two devices selected from a group of active and passive devices;

forming the first metal layer to further comprise portions connecting to the at least two devices in the second area;

forming the first metal layer to further comprise a portion electrically connecting a portion of the first metal layer in the first area to a portion of the first metal layer in the second area and thereby extending in the scribe area, wherein the step of forming a first metal layer further comprises forming a plurality of isolated metal layer portions in the first area and each electrically isolated from one another, and further comprising forming a plurality of electrical contacts, each in electrical communication with a different one of the plurality of isolated metal layer portions.

3. The method of claim 2 wherein each of the plurality of isolated metal layer portions extends into the scribe area.

4. The method of claim 3 wherein each of the plurality of electrical contacts is located in the scribe area.

5. The method of claim 4:

wherein the plurality of electrical contacts comprises a first plurality of electrical contacts;

and further comprising forming a second plurality of electrical contacts in the first area and for communicating electrical signals with the first integrated circuit die;

wherein each of the second plurality of electrical contacts is electrically isolated from the scribe area and the second area; and wherein the first plurality of electrical contacts outnumber the second plurality of electrical contacts.

6. A method of forming a plurality of integrated circuit die on a semiconductor wafer, comprising:

forming a first integrated circuit die in a first area in a fixed position relative to the semiconductor wafer, comprising the steps of:

forming at least two devices in the first area, the at least two devices selected from a group of active and passive devices;

forming a first metal layer comprising portions connecting to the at least two devices in the first area;

forming a second integrated circuit die in a second area in a fixed position relative to the semiconductor wafer, the second area separated from the first area by a scribe area, comprising the steps of:

forming at least two devices in the second area, the at least two devices selected from a group of active and passive devices;

forming the first metal layer to further comprise portions connecting to the at least two devices in the second area;

forming the first metal layer to further comprise a portion electrically connecting a portion of the first metal layer in the first area to a portion of the first metal layer in the second area and thereby extending in the scribe area, wherein the portion electrically connecting a portion of the first metal layer in the first area to a portion of the first metal layer in the second area comprises a first portion;

wherein the step of forming the first metal layer further comprises:

forming a second portion of the first metal layer in the first area and for communicating electrical signals with respect to the first integrated circuit die; and forming a third portion of the first metal layer in the second area and for communicating electrical signals with respect to the second integrated circuit die;

wherein the second portion is electrically disconnected from the third portion; and further comprising forming a test circuit in the scribe area and having a first input connected to the second portion and second input connected to the third portion.

7. The method of claim 6 wherein the test circuit comprises at least one logic gate.

8. The method of claim 6 wherein the test circuit comprises a state machine.

9. The method of claim 6 wherein the test circuit comprises a multiplexer.

10. The method of claim 9 wherein the multiplexer as an output, and further comprising:

at a first time testing the first integrated circuit die by controlling the multiplexer to couple the first input to the output; and at a second time testing the second integrated circuit die by controlling the multiplexer to couple the second input to the output.

11. A method of forming a plurality of integrated circuit die on a semiconductor wafer, comprising:

forming each of the plurality of integrated circuit die in a respective area on the semiconductor wafer;

wherein each respective area is isolated from other respective area by a scribe area;

wherein each of the plurality of integrated circuit die is operable to perform functionality after each of the plurality of integrated circuit die is physically separated from the semiconductor wafer; and wherein the step of forming a plurality of integrated circuit die on the s semiconductor wafer comprises, for each of the plurality of integrated circuit die, the steps of:

completing circuitry for performing the functionality; and no later than the completing step, forming a metal layer that comprises at least one intra-die portion and at least one inter-die portion, wherein the inter-die portion extends into the scribe area, forming a plurality of shared contacts in the scribe area, wherein each of the plurality of shared contacts is electrically connected to an inter-die portion of at least two of the plurality of integrated circuit die; and forming at least one isolated contact for each of the plurality of integrated circuit die wherein the isolated contact for each integrated circuit die is electrically isolated from all other of the plurality of integrated circuit die.

12. The method of claim 11 and further comprising forming a plurality of shared contacts in the scribe area, wherein each of the plurality of shared contacts is electrically connected to an inter-die portion of at least two of the plurality of integrated circuit die.

13. The method of claim 12 and further comprising a step of simultaneously testing a first one of the plurality of integrated circuit die and second one of the plurality of integrated circuit die by communicating a test signal between a test apparatus and one of the plurality of shared contacts.

14. The method of claim 11 and further comprising forming a plurality of shared contacts in the scribe area, wherein each of the plurality of shared contacts is electrically connected to an inter-die portion of all of the plurality of integrated circuit die.

15. The method of claim 14 and further comprising a step of simultaneously testing all of the plurality of integrated circuit die by communicating a test signal between a test apparatus and one of the plurality of shared contacts.

16. The method of claim 11, wherein the plurality of shared contacts outnumber a total of all of the isolated contacts.

* * * * *